United States Patent [19]  [11] Patent Number: 4,899,361
Numai  [45] Date of Patent: Feb. 6, 1990

[54] OPTICAL FILTER DEVICE
[75] Inventor: Takahiro Numai, Tokyo, Japan
[73] Assignee: NEC Corporation, Tokyo, Japan
[21] Appl. No.: 181,137
[22] Filed: Apr. 13, 1988
[30] Foreign Application Priority Data
  Apr. 14, 1987 [JP] Japan .................................. 62-92257
[51] Int. Cl.⁴ ............................................. H01S 3/19
[52] U.S. Cl. ....................................... 372/50; 372/45; 372/96
[58] Field of Search ...................... 372/46, 50, 96, 45
[56] References Cited
  U.S. PATENT DOCUMENTS
  4,751,719  6/1988  Mito et al. .............................. 372/46

OTHER PUBLICATIONS
S. R. Chinn et al., "Analysis of the Transmission . . . Amplifiers", Optics Communications, vol. 10, No. 2, Feb. 1974, pp. 123-126.

Primary Examiner—James W. Davie
Attorney, Agent, or Firm—Sughrue, Mion, Zinn, Macpeak & Seas

[57] ABSTRACT

An optical filter device having an amplifying region including an active layer for amplifying light of a first predetermined wavelength band, a noise absorption region including a noise absorption layer which is transparent for light of the first predetermined wavelength band, and which absorbs light of a second predetermined wavelength band, a distributed feedback region positioned between the amplifying layer and noise absorption regions, and including no active layer and no noise absorption layer, electrodes provided on the top and back surfaces of the amplifying, noise absorption, and distributed feedback regions, and non-reflection structures provided on both outer end facets of the amplifying and noise absorption regions, wherein the amplifying, noise absorption, and distributed feedback regions include a common optical guiding layer, and a bandgap energy of the noise absorption layer is smaller than that of the optical guiding layer, and is larger than that of the active layer.

4 Claims, 2 Drawing Sheets

OPTICAL FILTER DEVICE

FIELD OF THE INVENTION

The invention relates to an optical filter device, and more particularly to an optical filter device in which a predetermined wavelength of an optical signal can be selected from optical wavelength multiplexed signals of as much as sixty or seventy channels.

BACKGROUND OF THE INVENTION

A conventional optical filter device is described on pages 123 to 126 of "OPTICS COMMUNICATION, Volume 10, number 2, Feb. 1974" as entitled "Analysis of the transmission, reflection and noise properties of distributed feedback laser amplifiers". The optical filter device comprises a distributed feedback structure having a diffraction grating which is advantageous in regard to a wavelength selection and an optically integrating property as compared to a Fabry-Perot resonator having cleaved facets.

Such an optical filter device is one of the important devices which is widely applied to an optical communication apparatus, an optical switching system, an optical information processing apparatus and so on to select a predetermined wavelength of an optical signal from optical wavelength multiplexed signals. In each application, the optical filter device is required to have a satisfactory property of a wavelength selection, and a large wavelength tuning range. The optical filter device is further desired to be a transmitting type of a wavelength selection filter device, through which a predetermined wavelength of an optical signal is passed because it is inevitably to be included in an optical integrated circuit.

In regard to the aforementioned transmitting type of a wavelength selection filter device, several devices have been studied. Among them, an optical filter device which comprises an optical feedback structure having a wavelength selection property in an optical amplifying device utilizing a semiconductor active layer is expected to be put into a practical use because the tuning of the wavelength selected is varied dependent on the density of carriers injected into the active layer and it is suited to be included in an optical integrated circuit. Especially, an optical filter device which comprises a distributed feedback structure having a diffraction grating as described in the aforementioned "OPTICS COMMUNICATIONS" is advantageous in regard to wavelength selection and an optically integrating property as explained before.

According to the conventional optical filter device, however, there is a disadvantage that an optical gain for a selected wavelength and an intensity of spontaneous emission light are changed in a case where a density of carriers injected into the active layer is adjusted for the turning of selected wavelength. As a result, a density of carriers injected into the active layer is limited to be adjusted in principle in obtaining predetermined properties of a wavelength selection and a ratio of signal to noise. For this reason, a turning range of a wavelength selection is as narrow as several Å so that the optical filter device is only used for selecting a predetermined wavelength of an optical signal from wavelength multiplexed signals of several channels.

SUMMARY OF THE INVENTION

Accordingly, it is an object of the invention to provide an optical filter device in which a tuning range of a selected wavelength is as broad as several tens of Å;

It is another object of the invention to provide an optical filter device which is used for selecting a predetermined wavelength of an optical signal from wavelength multiplexed signals of as much as several tens of channels.

According to the invention, an optical filter device comprises an amplifying region including an active layer for amplifying light of a first predetermined wavelength band, a noise absorption region including a noise absorption layer which is transparent for light of the first predetermined wavelength band, and which absorbs light of a second predetermined wavelength band, a distributed feedback region positioned between the amplifying layer and noise absorption regions, and including no active layer and no noise absorption layer, electrodes provided on the top and back surfaces of the amplifying, noise absorption, and distributed feedback regions, and non-reflection structures provided on both outer end facets of the amplifying and noise absorption regions, wherein the amplifying, noise absorption, and distributed feedback regions include a common optical guiding layer, and a bandgap energy of the noise absorption layer is smaller than that of the optical guiding layer, and is larger than that of the active layer.

BRIEF DESCRIPTION OF THE DRAWINGS

The invention will be explained in more detail in conjunction with following drawings wherein.

DESCRIPTION OF THE PREFERRED EMBODIMENTS

Figure 1:
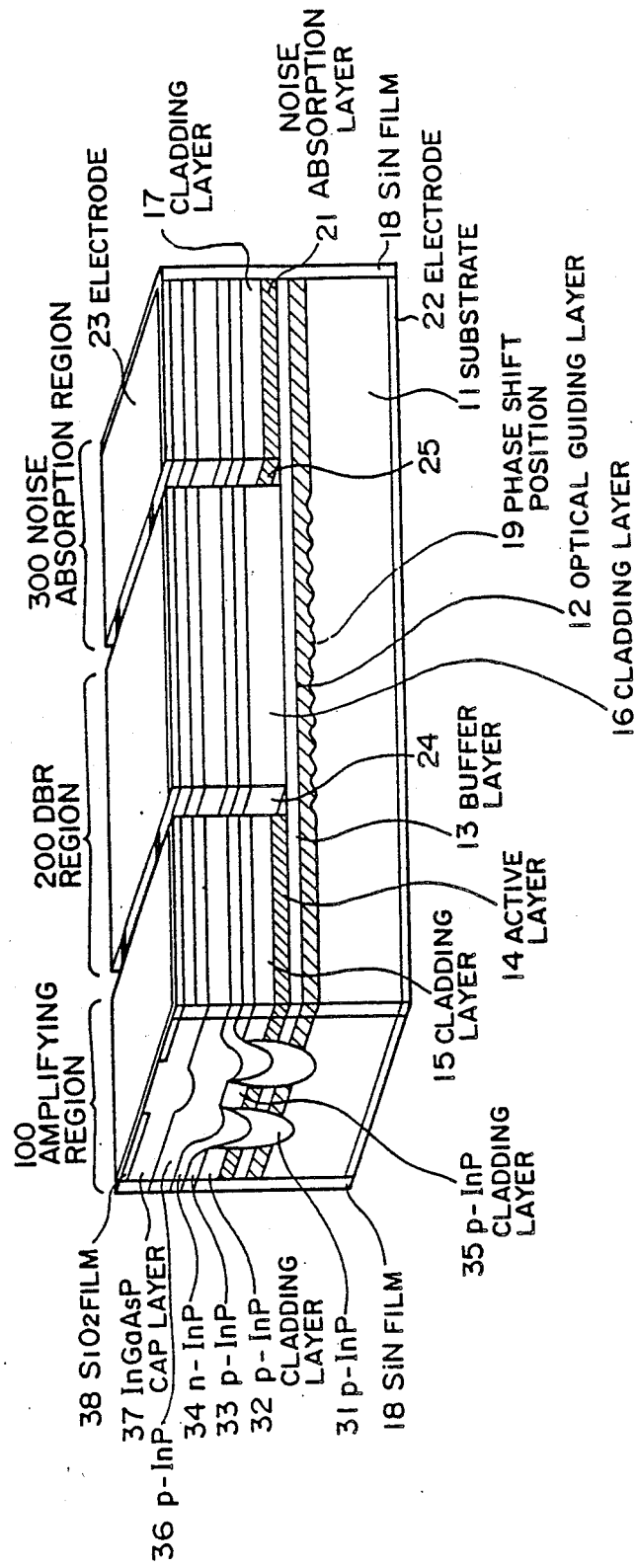
FIG. 1 is a perspective view showing an optical filter device in an embodiment according to the invention.

In FIG. 1, there is shown an optical filter device in an embodiment according to the invention. The optical filter device will be explained in accordance with a following fabricating procedure.

At first, a $\lambda/4$ shifted diffraction grating having a period of 2400Å is formed at a distributed feedback (DFB) region 200 on an n-InP substrate 11 where $\lambda$ is a wavelength of light propagated therein. Next, an optical guiding layer 12 of non-doped InGaAsP 12 having $\lambda g$ of 1.3$\mu$m and a thickness of 0.3$\mu$m which is transparent for light of 1.5$\mu$m band for the guiding of the light, a buffer layer 13 of n-InP having a thickness of 0.1$\mu$m, a non-doped active layer 14 having $\lambda g$ of 1.63$\mu$m and a thickness of 0.1$\mu$m for amplifying light of 1.5$\mu$m band, and a cladding layer 15 of p-InP having a thickness of 0.2$\mu$m are grown sequentially on the substrate 11 in a first liquid phase epitaxy. The cladding layer 15 and the active layer 14 are then etched to be removed selectively at the DFB region 200 and a noise absorption region 300. At the present stage, the etching is stopped in the presence of the buffer layer 13 so that the buffer layer 13 and the optical guiding layer 12 remain unchanged. Thereafter, a non doped noise absorption layer 21 having $\lambda g$ of 1.4$\mu$m and a thickness of 0.1$\mu$m, and a cladding layer of p-InP 17 having a thickness of 0.2$\mu$m are grown sequentially at the noise absorption region 300 on the buffer layer 13 in a second liquid phase epitaxy. The noise absorption layer 21 is transparent for light of 1.5μm, and has a function to absorb light of 1.3μm band induced in the optical guiding layer 12 effectively. That is, a band gap of the noise absorption layer 21 is smaller than that of the optical guiding layer 12 and larger than that of the active layer 14. In a third liquid phase epitaxy, a cladding layer 16 is grown overall thereon. Then, a buried growth is performed to provide a buried heterostructure in a fourth liquid phase epitaxy after a mesa etching is finished. As clearly understood from the illustration therein, a double channel planar buried heterostructure is utilized in the embodiment. In the double channel planar buried hetero structure, 31 and 33 are p-InP layers, 32 is a p-InP cladding layer (equal to the cladding layers 15 and 35), 34 is an n-InP layer, 36 is a p-InP layer, 37 is a InGaAsP cap layer, and 38 is a SiO$_2$ film. Next, electrodes 22 and 23 are provided on the back surface of the substrate 11 and the top surface of the grown layers respectively, and grooves 24 and 25 each having a width of 20 μm are provided except for a central mesa portion between an amplifying region 100 and the DFB region 200 and between the DFB region 200 and the noise absorption region 300 so that electrical isolations are obtained therebetween. Finally, SiN films 18 are provided on both outer facets of the device by use of a plasma CVD so that a reflectivity is decreased down to less than one percent (1%) thereon. In the embodiment, lengths of the amplifying regions 100, the DFB region 200, and the noise absorption region 300 are 100 μm, 500 μm, and 100 μm, respectively.

Figure 2:
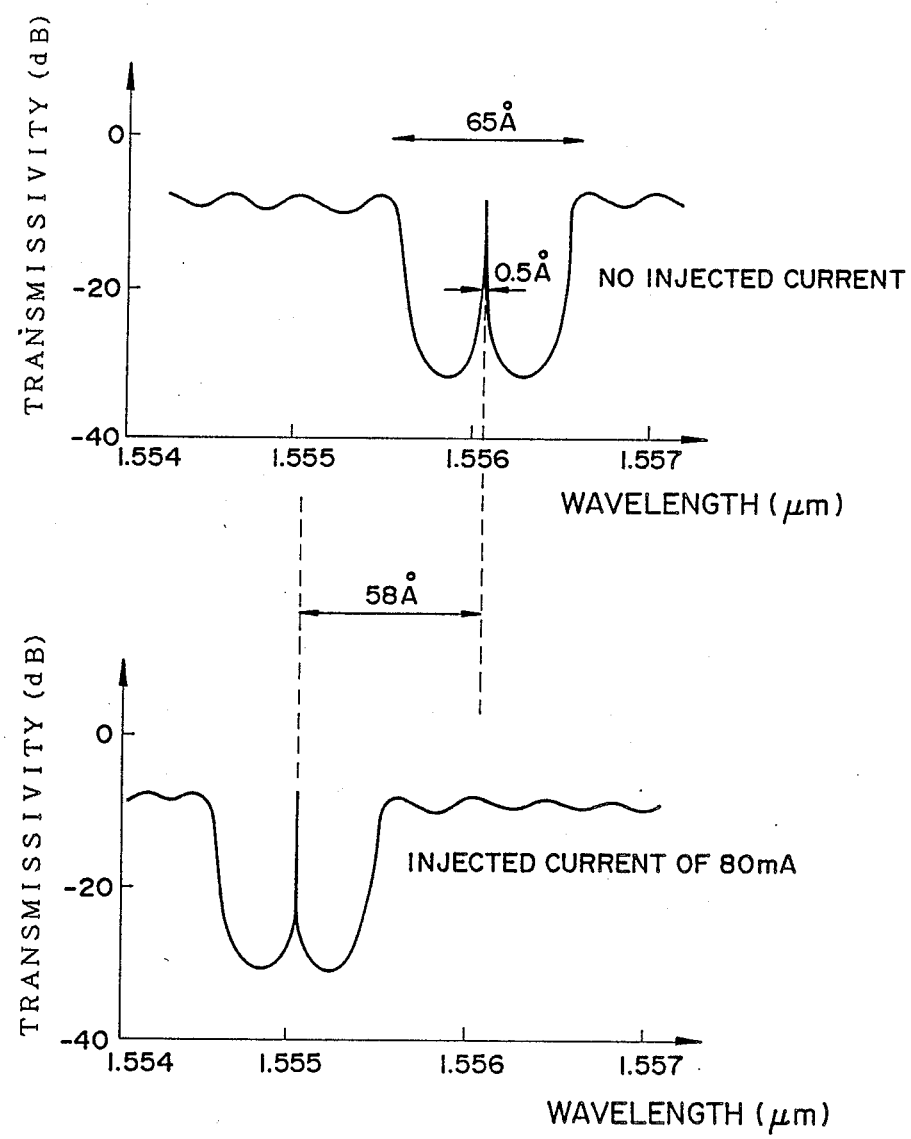
FIG. 2 is an explanatory diagram showing light transmitting properties of the optical filter device in the embodiment according to the invention.

FIG. 2 shows light output spectra of the optical filter device which is fabricated as described in FIG. 1. In a case where electric current of 50mA is injected into the amplifying region 100, a light extinction ratio of more than 20 dB is obtained, and a bandwidth is 0.5Å at an attenuation of 10dB. Further, a transmitting wavelength is 1.5563μm in a case where no electric current is injected into the DFB region 200 and the noise absorption region 300, while a transmitting wavelength is shifted to be 1.5505μm by 58Å in a case where electric current of 80mA is injected into the DFB region 200. As understood from the illustration in FIG. 2, a predetermined wavelength of an optical signal can be selected from optical wavelength multiplexed signals by a wavelength interval of 0.5Å in a half band of a wavelength stopband, that is, in a band of approximately 30Å. In other words, the optical filter device can be used for selecting a predetermined wavelength of an optical signals from optical wavelength multiplexed signals of as much as sixty channels.

Next, operation of an optical filter device according to the invention will be explained in more detail. In an optical transmitting property of an optical waveguide having a distributed feedback structure, a stopband of approximately several tens Å is formed with the center at a Bragg wavelength determined in accordance with an optical period of a diffraction grating of the distributed feedback structure when optical phases of a distributed feedback region are aligned to each other in a case where there is no optical gain in a wavelength passband. On the other hand, in a case where optical phases are deviated in the distributed feedback region on both sides of the center thereof by π, that is, in the so-called λ/4 shifted structure in which a pitch of a diffraction grating is deviated by λ/4 where λ is a wavelength of light to be propagated in the device, a stopband is split to produce a narrow wavelength passband of less than approximately 1 to 2Å in the center of the aforementioned stopband of approximately several tens of Å. In a case where an optical waveguide which comprises a distributed feedback region having a λ/4 shifted structure is fabricated using a semiconductor of a composition whose band gap wavelength is shorter than a transmitting wavelength, there results no optical gain therein. For this reason, a wavelength selection width of less than approximately 1 to 2Å is obtained with the center at a Bragg wavelength in accordance with the injection of carriers thereinto, and there is expected no deterioration in a ratio of signal to noise caused by spontaneous emission light. Further, a phase shift amount can be adjusted by injecting electric current into a phase shift region externally from the device. As a result, a transmitting type of an optical filter device in which a variable tuning can be performed by selecting a predetermined wavelength of an optical signal in a wavelength range of several to several tens of Å, the center of which is the Bragg wavelength, for the reason why transmitting properties are varied in accordance with a phase shift amount as shown in FIG. 2. That is, a variable wavelength width, which is larger than that in a fixed phase shift amount, is achieved by changing a phase shift amount in the invention.

In the invention, an active region and distributed feedback region are optically combined to provide an optical filter device having an amplifying function because there is no optical gain in the aforementioned optical waveguide. That is, an optical filter device having an amplifying function is obtained in accordance with a structure in which light is transmitted through a distributed feedback region after the light is injected into an active region.

In the invention, further, attention has been paid to following two points. One is that nonreflection structures must be provided on both facets of the optical filter device. The reason for this is that an oscillation is produced therein unless the nonreflection structures are provided. An other is that spontaneous emission is produced to provide noise source therein if electric current is injected into the distributed feedback region. In this respect, a noise absorption region having a band gap smaller than that of the distributed feedback region and larger than that of the amplifying region having an amplifying function is provided in an input region of the optical filter device. If no electric current is injected into the noise absorption region, spontaneous emission light induced in the distributed feedback region is absorbed in the noise absorption region so that noise is reduced in the optical filter device.

In the embodiment as shown in FIG. 1, the materials and compositions may be replaced by other materials and compositions. Further, a phase shift degree may be controlled from the external so that a tuning wavelength range can be expanded by more than five Å. As a result, an optical filter device according to the invention can be used for selecting a predetermined wavelength of an optical signal from wavelength multiplexed signals of as much as approximately seventy channels. Still further, a diffraction grating having a phase shift may be replaced by a phase shift structure in which an uniform diffraction grating is formed and a width and thickness of an optical wavelength are changed, an optical waveguide structure is not limited to a planar structure or a buried structure, but may be a structure having an optical waveguide function, and a non-reflection structure may be a window structure or a multilayer coated structure.

Although the invention has been described with respect to specific embodiment for complete and clear disclosure, the appended claims are not to be thus limited but are to be construed as embodying all modification and alternative constructions that may occur to one skilled in the ar which fairly fall within the basic teaching herein set forth.

What is claimed is

1. An optical filter device comprising:
an amplifying region including an active layer for amplifying light of a first predetermined wavelength band;
a noise absorption region including a noise absorption layer which is transparent for light of said first predetermined wavelength band, and which absorbs light of a second predetermined wavelength band;
a distributed feedback region positioned between said amplifying and noise absorption regions, and including no active layer and no noise absorption layer;
electrodes provided on the top and back surfaces of said amplifying, noise absorption, and distributed feedback regions; and
non-reflection structures provided on both outer and facets of said amplifying and noise absorption regions;
wherein said amplifying, noise absorption, and distributed feedback regions include a common optical guiding layer; and
a bandgap energy of said noise absorption layer is smaller than that of said optical guiding layer, and is larger than that of said active layer.

2. An optical filter device according to claim 1:
wherein said distributed feedback region includes a diffraction grating having a phase shift in its center position.

3. An optical filter device according to claim 1:
wherein said active, distributed feedback, and noise absorption regions are partially isolated from others by grooves provided between the two adjacent regions.

4. An optical filter device according to claim 1,
wherein said distributed feedback region is electrically isolated from said amplifying region and noise absorption region by the presence of grooves.

* * * * *